(12) United States Patent
Luft et al.

(10) Patent No.: US 9,985,522 B1
(45) Date of Patent: May 29, 2018

(54) DIGITAL CONTROL ALGORITHM USING ONLY TWO TARGET VOLTAGE THRESHOLDS FOR GENERATING A PULSE WIDTH MODULATED SIGNAL DRIVING THE GATE OF A POWER MOS TO IMPLEMENT A SWITCH MODE POWER SUPPLY

(71) Applicant: NXP USA, Inc., Austin, TX (US)

(72) Inventors: Stefan G. Luft, Munich (DE); Andreas J. Roth, Eching (DE); Hubert M. Bode, Haar (DE)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/703,502

(22) Filed: Sep. 13, 2017

(51) Int. Cl.
*H02M 3/157* (2006.01)
*H03K 7/08* (2006.01)
*H02M 1/08* (2006.01)
*H02M 1/00* (2006.01)

(52) U.S. Cl.
CPC .......... *H02M 3/157* (2013.01); *H02M 1/08* (2013.01); *H03K 7/08* (2013.01); *H02M 2001/0003* (2013.01)

(58) Field of Classification Search
CPC . H02M 2001/0003; H02M 2001/0009; H02M 2001/0012; H02M 1/08; H02M 3/156; H02M 3/157; H02M 3/158; H02M 3/335; H02M 3/33507; H02M 3/33515; H02J 7/022; H02J 7/0077
See application file for complete search history.

(56) References Cited

U.S. PATENT DOCUMENTS

| 9,680,382 B2* | 6/2017 | Vaughan | H02M 3/33507 |
| 2011/0241633 A1* | 10/2011 | Herzer | H02M 3/157 323/271 |
| 2012/0223691 A1 | 9/2012 | Weinstein et al. | |
| 2014/0177286 A1* | 6/2014 | Sonobe | H02M 3/33507 363/21.01 |
| 2015/0061612 A1 | 3/2015 | Bemoux et al. | |

(Continued)

FOREIGN PATENT DOCUMENTS

| EP | 0931374 B1 | 7/1999 |
| WO | WO9815997 A1 | 4/1998 |
| WO | WO2012119107 A1 | 9/2012 |

OTHER PUBLICATIONS

Simone Buso, Digital Control of Switching Mode Power Supplies, UNICAMP, Aug. 2011, 77 pages.

(Continued)

*Primary Examiner* — Emily P Pham
*Assistant Examiner* — Shahzeb K Ahmad

(57) ABSTRACT

A method and system are provided for digitally controlling a switch mode power supply without using analog-to-digital converters by providing an SMPS output in feedback to first and second comparators along with upper and lower reference voltage thresholds to detect excursion counts at dedicated counters which identify how many times an SMPS output voltage exceeds the upper and lower reference voltage thresholds during each cycle of a fixed frequency PWM signal, where the excursion counts are evaluated with a non-linear multi-step digital control loop detection sequence to generate duty cycle adjustment instructions for controlling each duty cycle of the fixed frequency PWM signal.

24 Claims, 6 Drawing Sheets

(56) References Cited

U.S. PATENT DOCUMENTS

| | | | |
|---|---|---|---|
| 2015/0244269 A1* | 8/2015 | Yu .......................... | H02M 1/44 |
| | | | 323/284 |
| 2015/0256165 A1 | 9/2015 | Lancaster et al. | |
| 2015/0263713 A1 | 9/2015 | Bode et al. | |
| 2015/0349639 A1* | 12/2015 | Hosoyama ............ | H02M 3/158 |
| | | | 323/271 |
| 2016/0126838 A1* | 5/2016 | Cavallini .............. | H02M 3/158 |
| | | | 315/185 R |
| 2016/0218630 A1* | 7/2016 | Huang .............. | H02M 3/33515 |
| 2016/0329734 A1* | 11/2016 | Lee ....................... | H02M 3/156 |

OTHER PUBLICATIONS

Srivatsa Raghunath, Digital Loop Exemplified, Texas Instruments, Application Report SLUA622, Dec. 2011, 20 pages.

* cited by examiner

DIGITAL CONTROL ALGORITHM USING ONLY TWO TARGET VOLTAGE THRESHOLDS FOR GENERATING A PULSE WIDTH MODULATED SIGNAL DRIVING THE GATE OF A POWER MOS TO IMPLEMENT A SWITCH MODE POWER SUPPLY

BACKGROUND OF THE INVENTION

Field of the Invention

The present invention is directed in general to power supplies. In one aspect, the present invention relates to test circuit for a switched mode power supply controller.

Description of the Related Art

In switched-mode power supplies (SMPS), a switching regulator is used to efficiently convert an input voltage to a desired output voltage. Typically, a switching regulator includes a DC/DC controller and a power section with drivers. There are several kind of switching regulators, including boost converters, buck converters, and buck and boost converters. The control circuitry may have voltage mode feedback or current mode feedback, and may use different types of compensation to generate the duty cycles for the power section. FIG. 1 is a simplified circuit diagram illustrating a switched mode power supply 100 which includes an input voltage Vin connected to a microcontroller integrated circuit (IC) unit 110 with an internal power transistor 103 connected in a buck-type DC/DC converter configuration to convert the input voltage Vin to an output voltage Vout at a regulated value over the entire range of Vin, where Vin is greater than Vout. While there are a variety of designs that are suitable for implementing DC/DC converters, the depicted buck-type DC/DC converter is constructed with passive output filtering components 105, including a serial coil inductor 106 coupled between a capacitor 107 and rectifier 108 to receive current from the PWM gated power transistor 103. In addition, a microcontroller IC unit 110 applies a gating pulse width modulation (PWM) signal 104 to a switch 103 which couples the input voltage Vin across the buffering capacitor 107 and rectifier 108 to charge the inductor 106, thereby generating an output supply voltage Vout across the load 102. The depicted controller unit 110 includes a sample and hold circuit 111, an analog-to-digital converter (ADC) 112 for generating a digital feedback signal, a controller 113 in which the digital feedback is substracted from a reference voltage Vref for application to a proportional-integral-derivative (PID) controller 115 which supplies an error value to a pulse width modulator (PWM) 116 which is connected to gate the switch 103. Unfortunately, there are challenges with providing ADC 112 in the microcontroller IC units due to process, design, and cost constraints. In addition, the depicted feedback control loop in the microcontroller IC unit 110 includes many delay stages, making it difficult to achieve regulation stability. As seen from the foregoing, the existing solutions for implementing a switch mode power supply control are extremely difficult at a practical level by virtue of the difficulty in balancing the design constraints and performance requirements for providing digital control to SMPS systems.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

A digital controller method, system, and apparatus for a switched mode power supply (SMPS) are provided for generating a pulse width modulated (PWM) signal for gating a power MOS transistor using only target voltage threshold comparators, thereby eliminating the need for analog-to-digital converter resources and improving SMPS performance on a microcontroller integrated circuit. In selected embodiments, the digital controller embodies a digital control loop algorithm for generating a PWM signal with a variable duty cycle by processing outputs ($CMP_{HI}$, $CMP_{LOW}$) from a high reference voltage comparator and a low reference voltage comparator, each connected in common to the output voltage ($V_{OUT}$) from the SMPS for comparison, respectively, to a high reference voltage threshold ($VREF_{HI}$) and a low reference voltage threshold ($VREF_{LOW}$). At each comparator, the output logic compare signal has a first value (e.g., logical "0") when the output voltage is below the corresponding reference voltage threshold or has a second value (e.g., logical "1") when the output voltage is at or above the corresponding reference voltage threshold. In selected embodiments, the digital control loop algorithm may be implemented with a duty value register, a clocked counter, and a PWM flip-flop which are connected to generate a PWM signal with a fixed period and adjustable duty cycles in response to the outputs from the reference voltage comparators. The duty value register stores an adjustable duty value which specifies the counter value when the PWM signal toggles from logical "0" to logical "1" and which may be maintained or adjusted up or down by a defined step count size (e.g., 6 clock counts) in response to the target voltage threshold comparator outputs which are accumulated over each PWM period to determine if an adjustment is needed. The clocked counter cycles through a clock count until reaching a "counter full" value at the end of the specified PWM period, and then restarts the count. The PWM flip-flop is set by the output of a comparator which detects when the counter reaches the duty value, and which is cleared when the clocked counter is full. With the PWM signal period selected on the basis of the inductor and capacitor values in the output filter, a clock frequency (e.g., 32 MHz) may be chosen that is significantly higher than the PWM signal frequency (e.g., 160 kHz), allowing the clocked counter to define the PWM signal period with a specified number of bits (e.g., at least 8 bits) and the variable value stored in the duty value register to define the duty cycle transition in the PWM signal from logical "0" to logical "1". With the disclosed digital control loop system and methodology, the digital controller can be embodied with RTL control logic in a microcontroller integrated circuit to implement a switch mode power supply with an internal power transistor driving an external control pin that drives the output filter.

Figure 1:
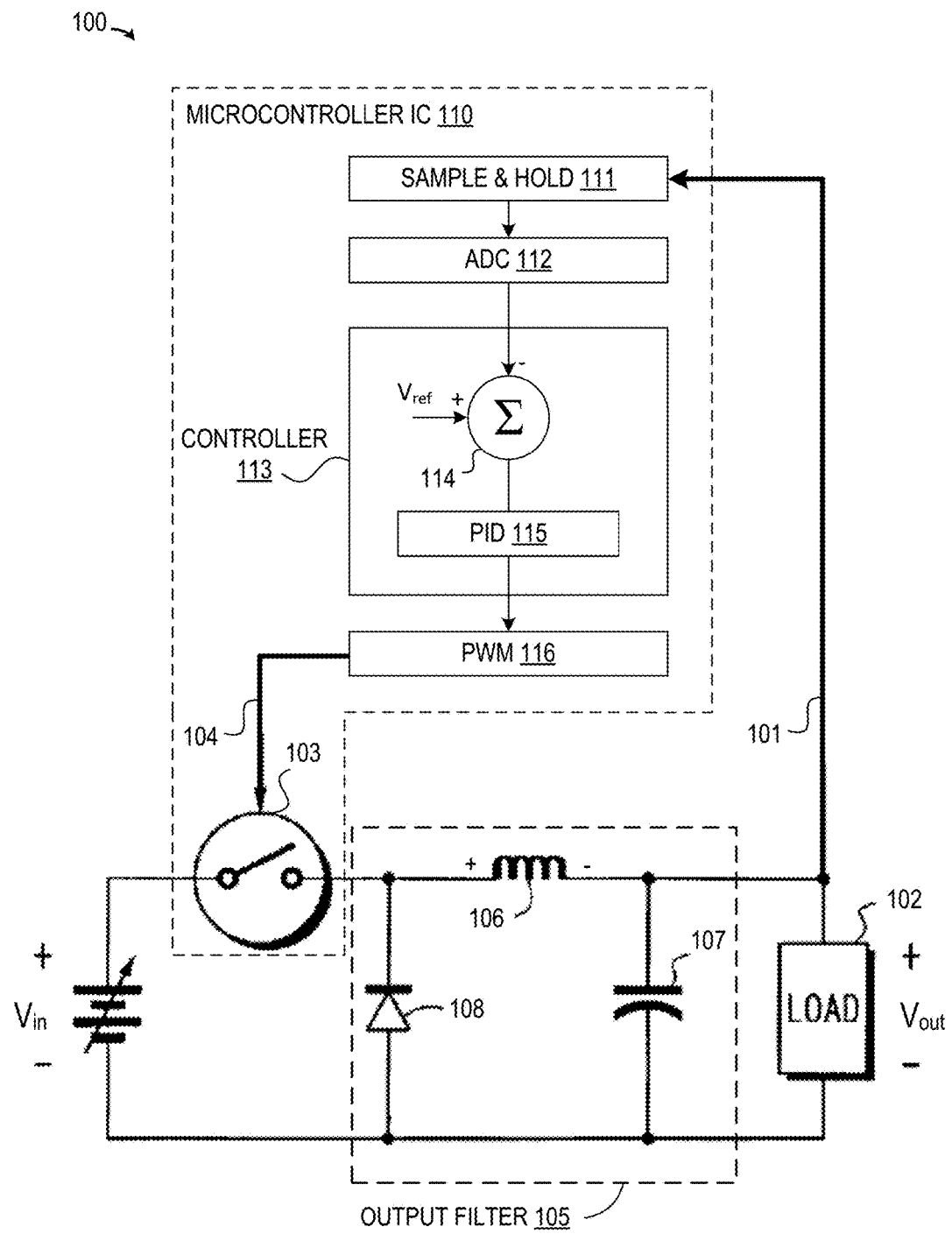
FIG. 1 is a simplified schematic circuit diagram illustrating a conventional switched mode power supply digital control loop.
Figure 2:
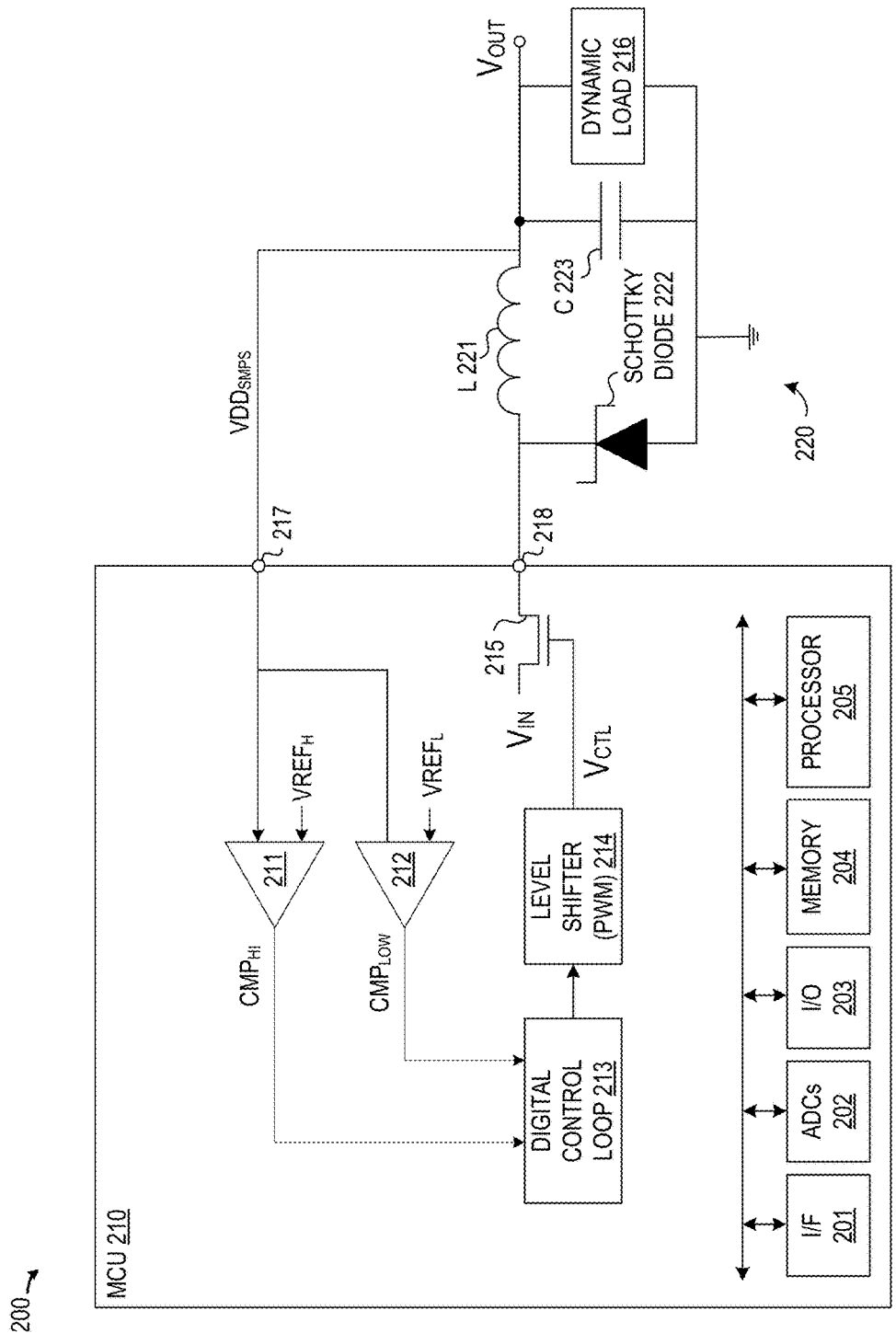
FIG. 2 is a simplified schematic circuit diagram illustrating a switched mode power supply controller unit in which a digital control loop compares the output voltage against target voltage thresholds at first and second comparators to control a pulse width modulator in accordance with selected embodiments of the disclosure.

Turning now to FIG. 2, there is depicted a simplified schematic circuit diagram 200 illustrating a switched mode power supply controller unit 210 in which a digital control loop 213 compares the output voltage $V_{OUT}$ against target voltage thresholds at first and second comparators 211, 212 to control a pulse width modulator 214 in accordance with selected embodiments of the disclosure. The depicted power supply is a digitally controlled SMPS which includes a controller unit 210 and DC/DC converter 220.

The depicted controller 210 may be implemented with a digital signal controller (DSC) or microcontroller unit (MCU) or any other controller to provide many advantages over mixed analog- and processor-controlled implementations. These include programmability, adaptability, reduced component count, design reusability, process independence, advanced calibration ability, and better performance. By using full digital control, the SMPS system not only saves limited analog resources (e.g., analog-to-digital converters) for use in other microcontroller applications, but also becomes a flexible SMPS solution that can realize complex control arithmetic that improves efficiency and lowers cost. A fully digital controller-based SMPS system integrates high-performance digital signal processing with power electronics, providing a new method for design of power electronics, and the typical high-level control and communication capability an SMPS system requires.

The depicted DC/DC converter 220 is connected as a buck converter circuit to receive an input voltage ($V_{IN}$) across a power transistor 215 at the control node 218, and to generate an output voltage ($V_{OUT}$), though other types of converter circuits (e.g., boost or buck/boost circuits) can be used. Though not shown, the input voltage ($V_{IN}$) may be provided by a voltage source, such as a battery, at an input pin for the MCU 210, while the output voltage ($V_{OUT}$) is tied to an output of the buck circuit 220 and to a feedback input pin 217 of the controller 210. When an input voltage ($V_{IN}$) is supplied across the power transistor 215 to the input node 218, the DC/DC converter 220 is operable to generate an output voltage ($V_{OUT}$). For many, if not all, applications, it is desirable to maintain the output voltage ($V_{OUT}$) at a regulated value over the entire range of $V_{IN}$. However, it will be appreciated that other types of converters and/or configurations may be used in other embodiments.

In the DC/DC converter 220, the input DC voltage ($V_{IN}$) is connected a source electrode of a switch transistor 215. The switch transistor 234 is shown as an NMOS transistor having a gate electrode connected to receive the PWM signal and a drain electrode connected to the input node 218, though PMOS switch transistors may be used with the appropriate correction of signal polarities. The drain electrode of the switch transistor 215 is connected across the input node 218 to a cathode terminal of a diode 222 (e.g., Schottky diode) which has its anode terminal grounded. The drain electrode of the switch transistor 215 is also connected across inductor 221 to the output node $V_{OUT}$. The inductor 221 is also connected to one or more additional load capacitors 223, each of which is grounded at the opposite electrode. An output voltage $V_{OUT}$ is developed at a junction connecting the inductor 221 and the additional load capacitor(s) 223.

With continued advances in CMOS and VLSI technology, the controller 210 may be implemented as a high-performance, practical, cost-effective, and low-power digital SMPS controller which includes a communication interface block 201, general-purpose ADCs (ADCs) 202, digital I/Os 203, memory 204, and a processing unit 205 that handles programming, communication, diagnostics, power management, user interface, configuration, etc. As will be appreciated, one or more of the identified components 201-205 are used to provide the requisite controller functionality described herein, except that the ADC resources 202 are not required for the digital control loop functionality of the present disclosure. The resulting digital controller 210 may be configured to regulate the output voltage, perform complex sequencing and monitor key parameters (e.g., average current and power output) with a fully digital control loop 213 which uses reference voltage threshold comparator circuits 211, 212 to control and adjust the duty cycle of a fixed frequency PWM signal which drives the power switch transistor 215 so that the output voltage ($V_{OUT}$) stays between target upper and lower output voltage thresholds.

In operation, an input voltage ($V_{IN}$) (e.g., reference voltage VDD) at source electrode of the power switch transistor 215 is operably connected to drive the buck circuit 220 under control of a buck driving signal ($V_{CTL}$) that is generated by the controller unit 210 and applied to the gate electrode of the power switch transistor 215. In selected exemplary embodiments, the controller 210 includes control logic for generating the buck driving signal ($V_{CTL}$) as an output square wave drive waveform having a fixed frequency with adjustably controlled duty cycles. There are three specific blocks that enable the controller 220 to achieve the high-performance regulation requirements of the buck circuit 230—namely, the high reference voltage comparator 211 which compares the output voltage to the upper target voltage threshold (VREF$_H$) to generate a first comparator output (CMP$_{HI}$), the low reference voltage comparator 212 which compares the output voltage to the lower target voltage threshold (VREF$_L$) to generate a second comparator output (CMP$_{LOW}$), and the digital control loop block 213 that uses the comparator outputs to adjust the duty cycle of the buck driving signal ($V_{CTL}$) generated by the level shifter 214.

Under control of the buck driving signal ($V_{CTL}$), electrical energy from the input voltage ($V_{IN}$) is transferred to the load at the output voltage ($V_{OUT}$) by repetitive pulsing provided by the switching of the power switch transistor 215 caused by application of the buck driving signal ($V_{CTL}$). Excess energy delivered from the input voltage ($V_{IN}$) is stored and unloaded in the reactive components, namely the inductor 221 and the one or more additional load capacitors 223. At the same time, constant power from the output voltage ($V_{OUT}$) is maintained across the dynamic load 216 by feeding back the output voltage ($V_{OUT}$) to the controller 210 via feedback input pin 217 for comparison to the upper and lower upper target voltage thresholds at the comparator circuits 211, 212, with the comparison results provided as inputs to the digital control loop unit 213.

One of the challenges with using controllers for SMPS systems is to provide a digital control loop which does not use analog resources (e.g., analog capture circuits, analog-to-digital converter circuits, etc.). In particular, it may be a relatively trivial matter to provide a feedback control loop which uses sample and hold circuitry with an ADC to drive a proportional, integral, derivative (PID) based controller, but such conventional approaches have difficulty achieving regulation stability due to the many delay stages in the control loop. As will be appreciated, these approaches also require use of valuable ADC resources which are not always available or at least have limited availability for microcontroller integrated circuits. In embodiments of the disclosure described herein, these and other disadvantages with convention approaches are addressed by the digital control loop 213 which uses only digital circuits and general purpose microcontroller resources to efficiently achieve regulation stability for the SMPS system.

Figure 3:
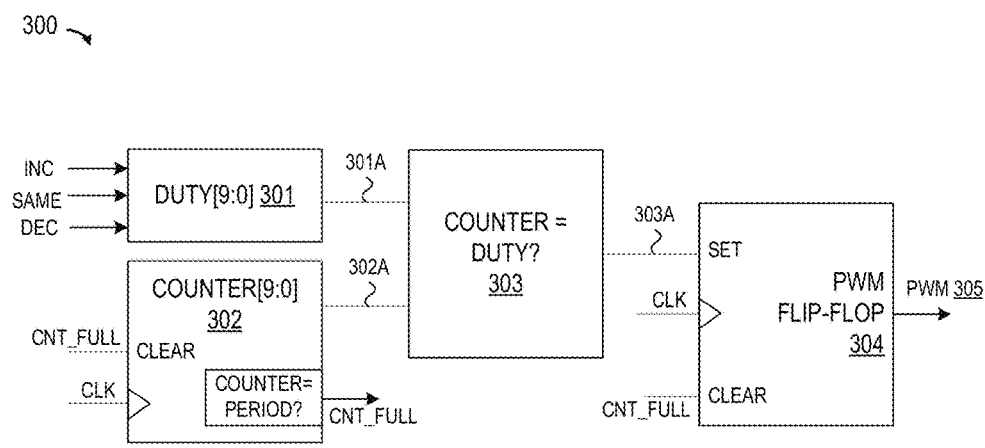
FIG. 3 is a simplified block diagram of a digital control loop unit for adjusting the duty cycle of a pulse width modulated signal in accordance with selected embodiments of the present disclosure.

To illustrated selected embodiments of the disclosed digital control loop, reference is now made to FIG. 3 which depicts a simplified block diagram of a digital control loop unit 300 for adjusting the duty cycle of a pulse width modulated signal. As illustrated, the digital control loop includes a duty value register 301, a clocked counter 302, a comparator 303, and a PWM flip-flop 304 which are connected to generate a PWM signal 305 with a fixed period and adjustable duty cycles in response to the outputs from the reference voltage comparators.

In particular, the duty value register 301 is connected to store and output an adjustable duty value 301A which specifies the counter value when the PWM signal toggles from logical "0" to logical "1." The stored duty value may be maintained in response to a first input signal (e.g., "SAME"), may be incremented or adjusted "up" in response to a second input signal (e.g., "INC"), and may be decremented or adjusted "down" in response to a third input signal (e.g., "DEC"), with each increment or decrement amount being a defined step count size (e.g., 6 clock counts). In selected embodiments, the input signals (DEC, SAME, INC) may be generated from the target voltage threshold comparator outputs using a variety of different algorithms. For example, the first comparator output ($CMP_{HI}$) may be monitored or accumulated over each PWM period to detect at each clock cycle whether the output voltage ($V_{OUT}$) has exceeded the upper target voltage threshold ($VREF_H$), in which case the decrement input signal (e.g., "DEC") is generated. Similarly, the second comparator output ($CMP_{LOW}$) may be monitored or accumulated over each PWM period to detect at each clock cycle whether the output voltage ($V_{OUT}$) has exceeded the lower target voltage threshold ($VREF_L$), in which case the increment input signal (e.g., "INC") is generated. If the output voltage ($V_{OUT}$) exceeds neither of the target voltage thresholds, then a "no change" input signal (SAME) is generated.

The clocked counter 302 is connected to store and output a counter value 302A in response to a clock input (CLK) and to generate a full count signal (CNT_FULL) which defines the period of the PWM signal so that the counter 302 cycles through a clock count until reaching a "counter full" value at the end of the specified PWM period, and then restarts the count by feeding back the full count signal as a "CLEAR" input to the counter 302. As will be appreciated, the frequency of the clock input (CLK) should be significantly higher than the frequency of the PWM signal 305 in order to achieve sufficient sampling resolution. In addition, it will be appreciated that the PWM period which is specified by the full count signal (CNT_FULL) is to be chosen depending on the value of the external inductor and capacitor components in the output filter.

At the comparator 303, the duty value 301A from register 301 is compared to the counter value 302A output from the clocked counter 302 to detect when the counter value has reached the duty value. When the counter 302 reaches the duty value, the comparator 303 supplies a set signal to the PWM flip-flop 304 which also receives the clock input (CLK) and the full count signal (CNT_FULL). In this way, the clocked PWM flip-flop 304 may be set (e.g., the PWM signal 305 goes "HIGH") when the counter 302 reaches the duty value in the register 301, and may be cleared (e.g., the PWM signal 305 goes "LOW") when the clocked counter 302 is full. In an example embodiment, the clock frequency (e.g., 32 MHz), having a significantly higher frequency than the PWM signal frequency (e.g., 160 kHz), allows the clocked counter 302 to define the PWM signal period with a specified number of bits (e.g., 10 bits) and the variable value stored in the duty value register 301 uses the same specified number of bits to define the duty cycle transition in the PWM signal from logical "0" to logical "1".

Figure 4:
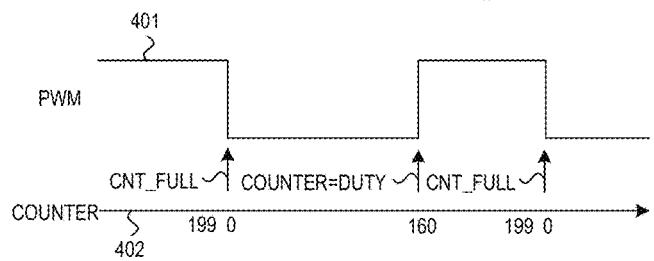
FIGS. 4-5 show pulse width modulated signals generated by the digital control loop unit depicted in FIG. 3.

To illustrate the operation of the digital control loop unit 300, reference is now made to FIG. 4 which shows a pulse width modulated signal 401 displayed above a counter timeline 402 with counter value indications to show that the PWM signal 401 is cleared or reset when the counter reaches the full count signal, and then is set or toggled when the counter reaches the duty value. In this example, the relationship between the clock frequency (e.g., 32 MHz) and selected PWM signal frequency (e.g., 160 kHz) defines the number of clock counts for the PWM period=32 Mhz/160 kHz=200 counts for the full count signal (CNT_FULL). Once the counter 302 reaches the full count signal, the PWM flip-flop 304 clears the PWM signal 401 until the counter 302 reaches the duty value (assumed to be 160 counts) when the PWM flip-flop 304 sets the PWM signal 401, toggling the PWM signal from logical "0" to logical "1" to define a first duty cycle of 20% for the PWM signal 401 corresponding to 160 beats at the logical "0" value and 40 beats at the logical "1" value. And for so long as the output voltage stays between target upper and lower output voltage thresholds, the PWM signal 401 will continue to be generated with the same duty cycle. However, any variation of the output voltage past either of the target output voltage thresholds will result in adjustments to the duty cycle of the PWM signal 401.

Figure 5:
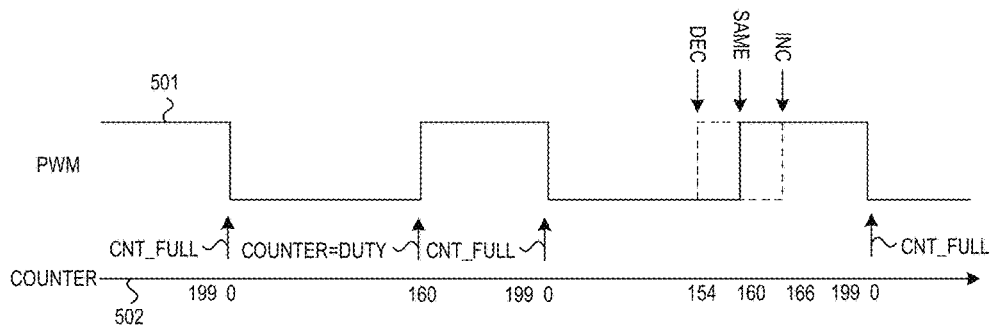

To illustrate how duty cycle adjustments are made by the digital control loop unit 300, reference is now made to FIG. 5 which shows a pulse width modulated signal 501 displayed above a counter timeline 502 with counter value indications to show that the PWM signal 501 is cleared or reset when the counter reaches the full count signal, and then is set or toggled when the counter reaches the duty value. In the depicted example, the PWM signal 501 starts off with the same duty cycle as shown in FIG. 4. However, upon detecting that the output voltage goes below a lower target voltage threshold ($VREF_L$), the duty cycle value stored in the register 301 is decremented by a specified amount (e.g., 6 counts) to define a new duty cycle count value (e.g., 154), effectively reducing the duration of the reset phase of the PWM signal 501 (and simultaneously increasing the duration of the set phase of the PWM signal 501) to effectively increase the output voltage. By the same token, upon detecting that the output voltage goes above an upper target voltage threshold ($VREF_H$), the duty cycle value stored in the register 301 is incremented by a specified amount (e.g., 6 counts) to define a new duty cycle count value (e.g., 166), effectively increasing the duration of the reset phase of the PWM signal 501 (and simultaneously decreasing the duration of the set phase of the PWM signal 501) to effectively reduce the output voltage. With this approach, the duty value may be increased (INC) or decreased (DEC) by a certain step size (e.g. 6 counts) or may stay the same (SAME), but the period of the fixed frequency PWM signal 501 remains the same. And while the digital control loop description refers to a decrease in the duty value as corresponding to an increase of duty cycle percentage since the PWM signal starts with a reset or logical "0" value, it will be appreciated that the nomenclature may be reversed if the PWM signal starts with a set or logical "1" value.

While the reference voltage threshold comparison techniques disclosed herein may be used to make uniform step size adjustments to the duty cycle, it will be appreciated that different adjustment sizes may be used, depending on the severity of threshold excursions by the output voltage. For example, large coarse grain adjustments to the duty cycle may be used when the output voltage exceeds the reference voltage threshold for all or a specified portion of the entire PWM period, while a smaller fine grain adjustment may be made when the output voltage exceeds the reference voltage threshold, but for less than the specified portion of the entire PWM period. In support of such embodiments, the comparator outputs ($CMP_{HI}$, $CMP_{LOW}$) may be separately monitored with dedicated counters (CNT_ABOVE, CNT_BELOW) to measure how many times the corresponding reference voltage threshold ($VREF_H$, $VREF_L$) is exceeded during a PWM period. Based on the accumulated values in the dedicated counters (CNT_ABOVE, CNT_BELOW), a decision is made at the end of the PWM period on the size of the step size adjustment. For example, if the value in the dedicated counter (CNT_ABOVE, CNT_BELOW) is equal to a PWM period count value (CNT_PERIOD) or a specified portion thereof, this indicates that the threshold was exceeded for the entirety of the PWM period, in which case a large step size (e.g., INC_B, DEC_B) may be used to adjust the value of the value stored in the duty value register. However, if the value in the dedicated counter (CNT_ABOVE, CNT_BELOW) is less than the PWM period count value (CNT_PERIOD) or a specified portion thereof, this indicates a less severe threshold violation by the output voltage, in which case a smaller step size (e.g., INC_A, DEC_A) may be used to adjust the value of the value stored in the duty value register.

Figure 6:
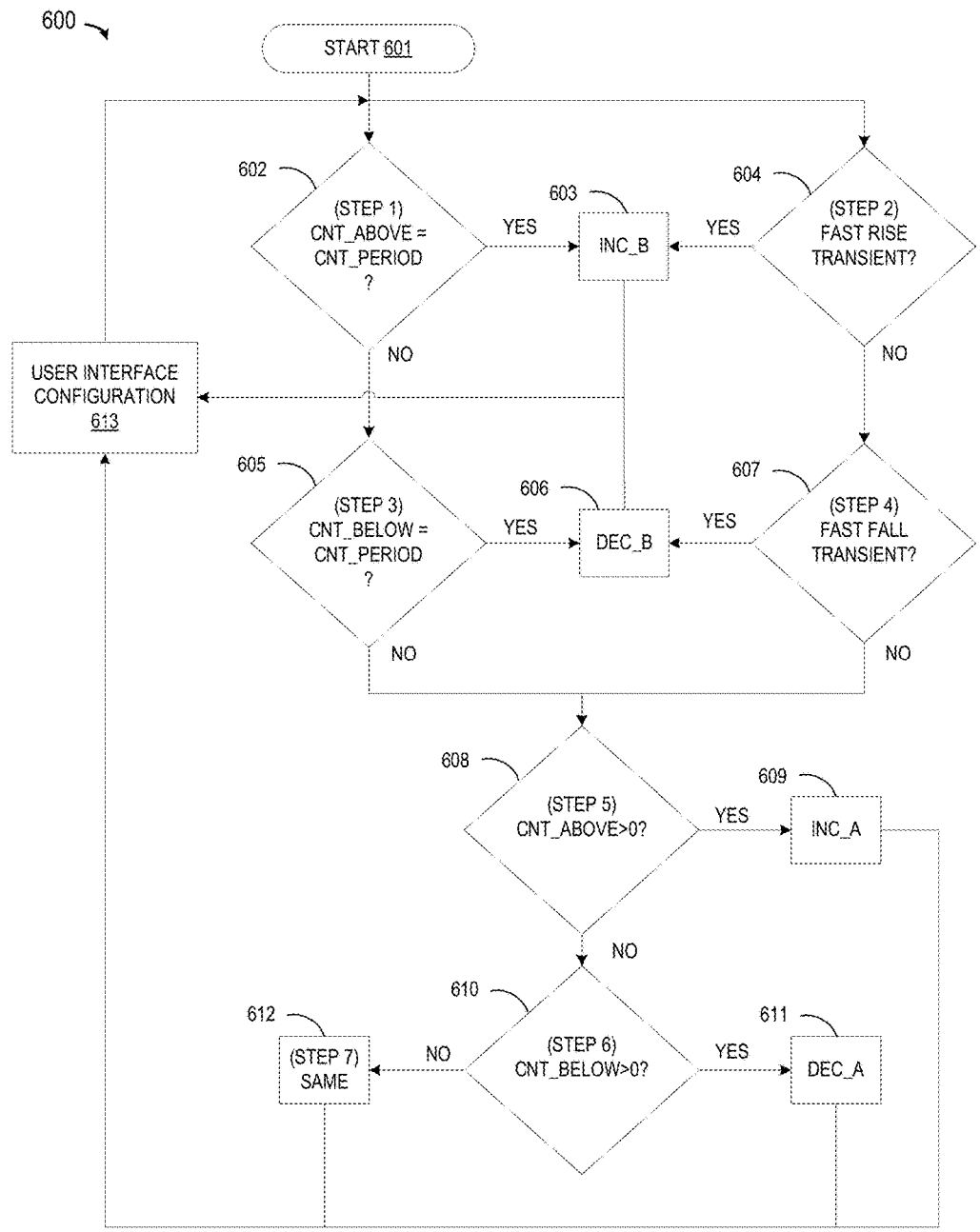
FIG. 6 illustrates a simplified flow chart showing the control logic for a switched mode supply in accordance with selected embodiments of the present disclosure.

To provide additional details for an improved understanding of selected embodiments of the present disclosure, reference is now made to FIG. 6 which illustrates a simplified flow chart 600 showing the control logic for a implementing a non-linear multi-step digital control loop detection sequence for a switched mode supply in accordance with selected embodiments of the present disclosure. In an example embodiment, the processing shown in FIG. 6 may be performed by a microcontroller or other processor-based functionality, such as a power management unit that is programmed with RTL code that is connected to evaluate the output voltage in feedback against upper and lower reference voltage thresholds in order to adjust the duty cycle of a PWM signal using both fine grain and coarse adjustments.

At step 601, the control logic and/or hardware at the microcontroller are configured to start the process for monitoring the SMPS to detect output voltage excursions past the specified upper and lower reference voltage thresholds (e.g., $VREF_H$ and $VREF_L$). As will be appreciated, dedicated voltage monitoring circuitry and/or software may be used to implement a digital control loop by retrieving one or more control parameter values specifying upper and lower reference voltage thresholds (e.g., $VREF_H$ and $VREF_L$), a full count signal value specifying the period for the PWM signal (e.g., CNT_FULL), one or more initial duty cycle values for the PWM signal (e.g., PWM_DUTY), and specified duty cycle adjustment values (e.g., INC_A, DEC_A, INC_B, DEC_B, SAME). Over the course of each PWM cycle, the output voltage is fed back to the high reference voltage comparator and low reference voltage comparator for comparison, respectively, with the high reference voltage threshold ($VREF_H$) and low reference voltage threshold ($VREF_L$) at each clock cycle of the clock input (CLK), and the comparison output results ($CMP_{HI}$, $CMP_{LOW}$) may be measured or counted at a corresponding dedicated counter (CNT_ABOVE, CNT_BELOW).

At step 602, a first detection step (step 1) is performed by comparing the output results stored in the dedicated counter (CNT_ABOVE)—which indicate the severity of any output voltage excursions past the upper reference voltage threshold ($VREF_H$)—with the PWM period count value (CNT_PERIOD). An example programming code sequence for the first detection step would evaluate whether the condition "CNT_ABOVE=CNT_PERIOD?" was met. If the condition was met (affirmative outcome to comparison step 602), this indicates that a relatively large duty cycle adjustment should be made to reduce the output voltage level by making a large coarse grain duty cycle increase adjustment (INC_B) to the duty value (at step 603), effectively reducing the duration of inductor charging in a given PWM cycle. However, if there is not a match detected (negative outcome to comparison step 602), then the process may proceed to step 605 (described below).

At the same time or subsequent to the comparison step 602, a second detection step (step 2) may optionally be performed to detect fast rise transients in the output voltage at step 604 which may be caused by sudden load changes on the output voltage. To detect sudden or fast rising transients in the output voltage, the CNT_BELOW value and the CNT_ABOVE value of the last PWM cycle are stored in two registers, CNT_BELOW_LAST and CNT_ABOVE_LAST. At step 604, these values from the last PWM cycle (CNT_BELOW_LAST, CNT_ABOVE_LAST) are compared to the values of the next PWM cycle to detect sudden positive transients in the output voltage. If the difference in counts between the current threshold excursions (CNT_BELOW, CNT_ABOVE) and past threshold excursions (CNT_BELOW_LAST, CNT_ABOVE_LAST) is more than the configured transient threshold value (DUTY_VAL_TRANSIENT), the process sets the next PWM duty value to push the output voltage in the opposite direction. As will be appreciated, the transient threshold value (DUTY_VAL_TRANSIENT) may be set as a predetermined fraction of the PWM period count value (CNT_PERIOD). In an example programming code sequence for the second detection step, the digital control loop would evaluate whether the following conditions are met:

((CNT_ABOVE[9:0]<CNT_ABOVE_LAST[9:0])&
(CNT_ABOVE_LAST[9:0]−CNT_
ABOVE[9:0]>=DUTY_VAL_
TRANSIENT[9:0]))|((CNT_BELOW[9:0]>
CNT_BELOW_LAST[9:0])&(CNT_
BELOW[9:0]−CNT_BELOW_LAST[9:0]>=
DUTY_VAL_TRANSIENT[9:0]).

If the conditions are met (affirmative outcome to comparison step 604), this indicates that a fast rise transient is detected. In this case, even if the normal decision would indicate that the output voltage should be driven up, the detected fast rise transient effectively overrides this decision with a new decision to drive the output voltage down by making a large coarse grain duty cycle increase adjustment (INC_B) to the duty value (at step 603) to reduce the duration of inductor charging in a given PWM cycle. However, if a fast rise transient is not detected (negative outcome to comparison step 604), then the process may proceed to step 605 or 607 (described below).

At step 605, a third detection step (step 3) may be performed to compare the output results stored in the dedicated counter (CNT_BELOW)—which indicate the severity of any output voltage excursions past the lower reference voltage threshold ($VREF_L$)—with the PWM period count value (CNT_PERIOD). An example programming code sequence for the third detection step would evaluate whether the condition "CNT_BELOW=CNT_PERIOD?" was met. If the condition was met (affirmative outcome to comparison step 605), this indicates that a relatively large duty cycle adjustment should be made to increase the output voltage level by making a large coarse grain duty cycle decrease adjustment (DEC_B) to the duty value (at step 606), effectively increasing the duration of inductor charging in a given PWM cycle. However, if there is not a match detected (negative outcome to comparison step 605), then the process may proceed to step 608 (described below).

At the same time or subsequent to the comparison step 605, a fourth detection step (step 4) may optionally be performed to detect fast fall transients in the output voltage at step 607 which may be caused by sudden load changes on the output voltage. To detect sudden reductions in the output voltage, the CNT_BELOW value and the CNT_ABOVE value of the last PWM cycle are compared at step 607 to the values of the next PWM cycle to detect sudden fall transients in the output voltage. In an example programming code sequence for the fourth detection step, the digital control loop would evaluate whether the following conditions are met:

((CNT_BELOW[9:0]<CNT_BELOW_LAST[9:0])&
(CNT_BELOW_LAST[9:0]−CNT_
BELOW[9:0]>=DUTY_VAL_
TRANSIENT[9:0]))|((CNT_ABOVE[9:0]>
CNT_ABOVE_LAST[9:0])&(CNT_
ABOVE[9:0]−CNT_ABOVE_LAST[9:0]>=
DUTY_VAL_TRANSIENT[9:0])).

If the conditions are met (affirmative outcome to comparison step 607), this indicates that a fast fall transient is detected. In this case, even if the normal decision would indicate that the output voltage should be driven down, the detected fast fall transient effectively overrides this decision with a new decision to drive the voltage up by making a large coarse grain duty cycle decrease adjustment (DEC_B) to the duty value (at step 606) to increase the duration of inductor charging in a given PWM cycle. However, if a fast fall transient is not detected (negative outcome to comparison step 607), then the process may proceed to step 608 (described below).

At step 608, a fifth detection step (step 5) may be performed by assessing the output results stored in the dedicated counter (CNT_ABOVE) to determine if there have been a minimum number of output voltage excursions past the upper reference voltage threshold ($VREF_H$). An example programming code sequence for the fifth detection step would detect if there had been at least one upper threshold excursion by the output voltage by evaluating whether the condition "CNT_ABOVE>0?" was met, though any value may be set for the minimum number. If the condition was met (affirmative outcome to comparison step 608), this indicates that a relatively small duty cycle adjustment should be made to decrease the output voltage level by making a small coarse grain duty cycle increase adjustment (INC_A) to the duty value (at step 609), effectively decreasing the duration of inductor charging in a given PWM cycle. However, if there is not a match detected (negative outcome to comparison step 608), then a sixth detection step (step 6) may be performed at step 610 which assesses the output results stored in the dedicated counter (CNT_BELOW) to determine if there have been a minimum number of output voltage excursions past the lower reference voltage threshold ($VREF_L$). An example programming code sequence for the sixth detection step would detect if there had been at least one lower threshold excursion by the output voltage by evaluating whether the condition "CNT_BELOW>0?" was met, though any value may be set for the minimum number. If the condition was met (affirmative outcome to comparison step 610), this indicates that a relatively small duty cycle adjustment should be made to increase the output voltage level by making a small coarse grain duty cycle decrease adjustment (DEC_A) to the duty value (at step 611), effectively increasing the duration of inductor charging in a given PWM cycle.

In the event that the comparison outcome from step 610 is negative, indicating that there are no affirmative outcome decisions from steps 601-610, the output voltage in this particular PWM cycle is between the lower and upper reference voltage thresholds. This may be treated as the seventh detection step (step 7) which may be implemented with an example programming code sequence which evaluates whether the conditions "CNT_BELOW=0?" and "CNT_BELOW=0?" are both met. If no change is required for the duty cycle, a "no change" adjustment instruction (SAME) is issued for the duty value (at step 612).

As will be appreciated, the non-linear multi-step digital control loop sequence 601-612 or a subset thereof may be repeated for the next PWM cycle. For example, a non-linear five-step detection sequence may be implemented in which the RTL code implements only detection step 1 (for detecting output voltage excursions which clearly exceed the upper reference voltage threshold), detection step 3 (for detecting output voltage excursions which clearly exceed the lower reference voltage threshold), detection step 5 (for detecting output voltage excursions which are in the region of the upper reference voltage threshold), detection step 6 (for detecting output voltage excursions which are in the region of the lower reference voltage threshold), and detection step 7 (for detecting when there are no output voltage excursions past the lower or upper reference voltage thresholds). In other embodiments, a non-linear seven-step detection sequence may be implemented in which the RTL code implements also includes detection step 2 (for detecting fast falling output voltage excursions) and detection step 4 (for detecting fast falling output voltage excursions).

In yet other embodiments, additional detection steps may be added to the digital control loop sequence. For example, an eighth detection step (step 8) may be performed to evaluate whether the duty cycle is within a specified range of values to account for the fact that the PWM signal must have a minimum "ON" or "OFF" times, and therefore cannot have values that extend for the entire range of the PWM period. On this point, it is noted that the power switch transistor that is controlled by the PWM signal has minimum rise and fall times when being switched ON or OFF, and therefore cannot follow PWM pulses below a minimum pulse width. To address this situation, a minimum pulse width value (STEP_SIZE) is defined for use by the eighth detection step for use in evaluating the current duty value (e.g., DUTY[9:0]) against upper and lower limits defining an allowed range of duty cycle values. An example programming code sequence for the eighth detection step would evaluate whether the condition "STEP_SIZE<DUTY[9:0]<(CNT_FULL−STEP_SIZE)?" was met. If the condition was met when DUTY value reaches its upper limit (CNT_FULL−STEP_SIZE), any issued increment step size instruction (INC_A or INC_B) is ignored and/or a "no change" input signal (SAME) is generated so that the DUTY value stays same. In similar, the DUTY value stays the same if the condition is met where the DUTY value reaches its lower limit (STEP_SIZE) so that any issued decrement step size instruction (DEC_A or DEC_B) is ignored.

A variation or extension of the eighth detection step (step 8) may be added to the digital control loop sequence to address the corner case which arises when the load on the SMPS changes to very low load. In this case, the minimum PWM pulse of duration STEP_SIZE is too much driving the voltage up far above the upper reference voltage threshold (VREF). An example programming code sequence for the eighth detection step would evaluate whether the condition "PWM_CLR=((CMP$_{HI}$=1) && (DUTY=(CNT_FULL−STEP_SIZE))" was met. If the PWM_CLR condition was met, the PWM should be turned OFF all the time.

Yet another variation or extension of the non-linear multi-step digital control loop sequence 601-612 is to include a user interface configuration step (613) to allow one or more configuration parameters to be set through a user interface to adapt the digital control loop to the values in the user's external components (coil, cap) and static and dynamic LOAD profile. For example, the user interface configuration step 613 may be used to set the frequency of the PWM signal by configuring or setting the PERIOD value. In addition, the user interface configuration step 613 may be used to configure or set a coarse adjustment step size parameter (e.g., STEP SIZE B) which is used for the first and second adjustment instructions (e.g., INC_B, DEC_B), and/or may be used to configure or set the fine adjustment step size parameter (e.g., STEP SIZE A) which is used for the third and fourth adjustment instructions (e.g., INC_A, DEC_A). Once the coarse adjustment step size parameter (e.g., STEP SIZE B) is configured, the minimum duty value (e.g., DUTY_MIN) may be automatically calculated by the hardware (e.g., STEP SIZE) so that any issued decrement step size instruction (DEC_A or DEC_B) below that value is ignored. In similar fashion, the maximum duty value (e.g., DUTY_MAX) may be automatically calculated by the hardware (e.g., PERIOD−STEP SIZE) so that any issued increment step size over that value is ignored. Finally, the user interface configuration step 613 may be used to configure the sensitivity threshold to detect a fall or rise transient by setting or configuring the parameter (e.g., DUTY_VAL_TRANSIENT). To indicate that the user configuration step 613 is integrated in the digital control loop, each of the increment or decrement steps 603, 606, 609, 611, 612 are shown as connecting back through the user interface configuration step 613, though it will be appreciated that the specific sequence for getting updated digital control loop parameters may be continually or periodically checked in any desired arrangement of processing steps.

Figure 7:
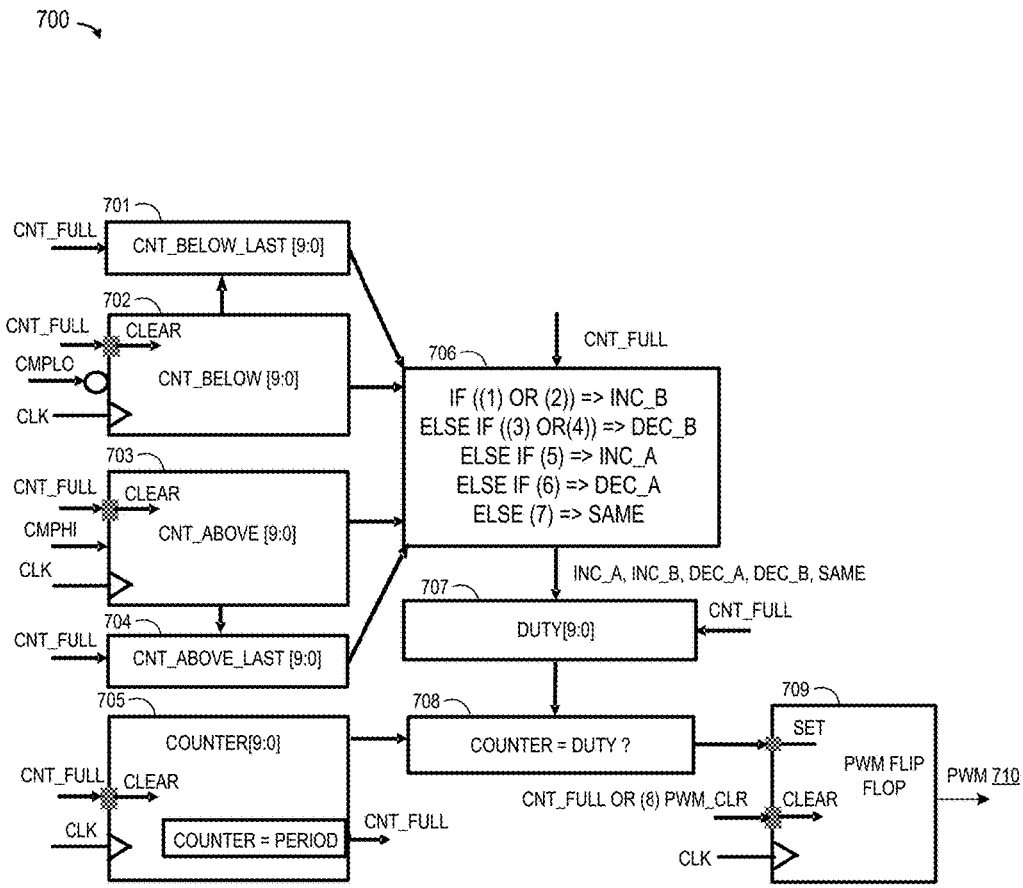
FIG. 7 is a simplified block diagram hardware architectural description of the control logic for adjusting the duty cycle of a pulse width modulated signal in accordance with selected embodiments of the present disclosure.

To provide additional details for an improved understanding of selected embodiments of the present disclosure, reference is now made to FIG. 7 which is a simplified hardware architectural block diagram of the control logic (e.g., RTL) for implementing the digital control loop 700 to adjust the duty cycle of a pulse width modulated signal in accordance with selected embodiments of the present disclosure. In the depicted digital control loop hardware architecture 700, a plurality of registers, counters, and comparators are connected to adjust the duty cycle of a PWM signal 710 using both fine grain and coarse adjustments.

At a first clocked counter 702, a first comparator output CMP$_{LOW}$ is received at a first inverted input to increment the running count (CNT_BELOW) of the number of output voltage excursions at each clock cycle which exceed the lower reference voltage threshold (VREF$_{LOW}$) over the duration of the PWM period. At the end of each PWM period signaled by the full count signal (CNT_FULL), the accumulated results from the first clocked comparator 702 are clocked or transferred to a first storage register 701 (CNT_BELOW_LAST). In addition, the full count signal (CNT_FULL) also clears or resets the first clocked counter 702.

In addition, a second clocked counter 703 receives a second comparator output CMP$_{HI}$ at a first input to increment the running count (CNT_ABOVE) of the number of output voltage excursions at each clock cycle which exceed the upper reference voltage threshold (VREF$_{HI}$) over the duration of the PWM period. At the end of each PWM period signaled by the full count signal (CNT_FULL), the accumulated results from the SECOND clocked comparator 703 are clocked or transferred to a second storage register 704 (CNT_ABOVE_LAST), and the second clocked counter 703 is then cleared or reset.

At the end of each PWM cycle (signaled by the CNT_FULL signal), a comparator 706 evaluates the values stored in clocked counters 702, 703 and the storage registers 701, 704 with a plurality of detection steps to issue appropriate duty value adjustment instructions to the DUTY value stored in the duty value register 707 at the conclusion of each PWM cycle. For example, if affirmative outcomes are generated from either the first detection step (1) or second detection step (2) (described hereinabove), then a first adjustment instruction (INC_B) is issued to make a relatively large duty cycle adjustment to increase the duration of the non-charging phase of the PWM signal, thereby reducing the output voltage charging in a given PWM cycle. However, if affirmative outcomes are generated from either the third detection step (3) or fourth detection step (4) (described hereinabove), then a second adjustment instruction (DEC_B) is issued to make a relatively large duty cycle adjustment to decrease the duration of the non-charging phase of the PWM signal, effectively increasing the output voltage charging in a given PWM cycle. Failing affirmative outcomes from detections steps (1)-(4), an affirmative outcome from the fifth detection step (5) will cause a third adjustment instruction (INC_A) to issue to make a relatively small duty cycle adjustment to increase the duration of the non-charging phase of the PWM signal, albeit by a smaller amount than for the first adjustment instruction (INC_B). Likewise, an affirmative outcome from the fifth detection step (6) will cause a fourth adjustment instruction (DEC_A) to issue to make a relatively small duty cycle adjustment to decrease the duration of the non-charging phase of the PWM signal by a smaller amount than for the second adjustment instruction (DEC_B). Failing affirmative outcomes from detections steps (1)-(6), an affirmative outcome from the seventh detection step (7) will cause a fifth adjustment instruction (SAME) to issue so that there is no duty cycle adjustment to the PWM signal.

As described above, the comparator 706 and each of the counters 702, 703, registers 701, 704, 707 are triggered for action by the full count signal (CNT_FULL) which is generated by the PWM counter 705 which is clocked to keep a running COUNTER value. When the COUNTER value reaches the count corresponding to the period of the PWM signal, the PWM counter 705 issues the full count signal (CNT_FULL) which is connected to the other counters and registers and also as a feedback input signal to reset or clear the PWM counter 705.

At a duty comparator 708, the running count from the PWM counter 705 is compared against the DUTY value stored in the duty value register 707. Whenever there is a match, the duty comparator 708 sets the PWM flip-flop 709, causing the PWM signal 710 to toggle from logical "0" to logical "1". However, when the full count signal (CNT_FULL) is reached (indicating the end of the PWM period), the PWM flip-flop 709 is reset or cleared, causing the PWM signal 710 to toggle from logical "1" to logical "0". As described herein, there may also be special cases when the PWM signal 710 is turned "OFF", such as when the eighth detection step (8) detect the corner case where the SMPS load changes to a very low load. In such cases, the PWM flip-flop 709 is reset or cleared by setting the PWM_CLR signal.

Figure 8:
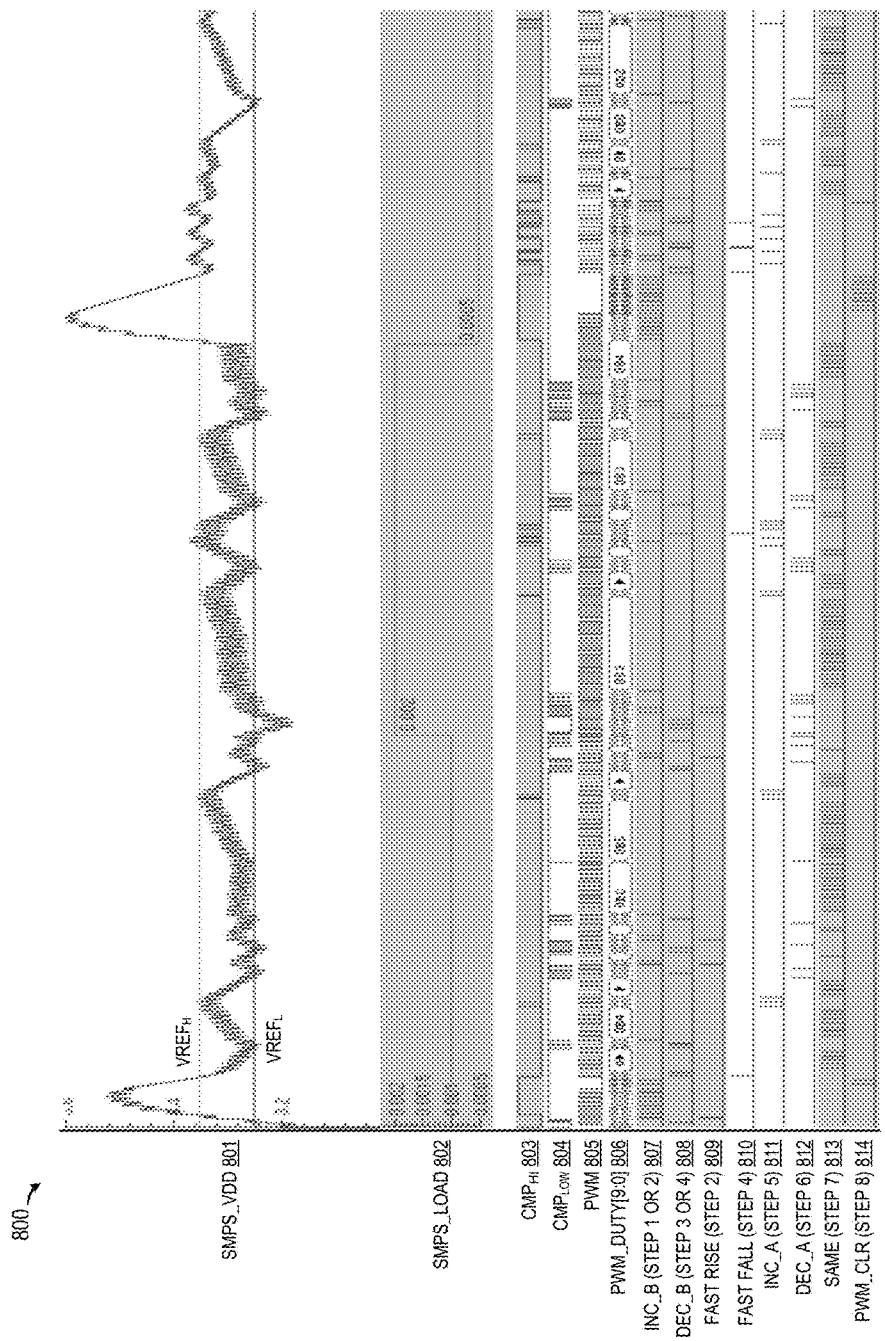
FIG. 8 shows simulation result waveforms of the switched mode power supply digital control loop in accordance with selected embodiments of the present disclosure.

To illustrate the operation of an example SMPS digital control loop which uses only two target voltage thresholds to control the PWM signal for driving the SMPS system, reference is now made to FIG. 8 which shows a plurality of simulation result waveforms 801-814 of the switched mode power supply digital control loop. As depicted, the output voltage waveform 801 represents the SMPS output (SMPS_VDD) which varies over time about a target output value (e.g., 3.3V) and which is applied to the SMPS load 802 which may also change over time. With the output voltage 801 fed back as an input to the upper and lower target voltage threshold comparators (not shown), any excursions past boundary voltage values are detected and used to make corrections or adjustments to the output voltage 801. In particular, the output voltage 801 may be adjusted by modifying the duty cycle of the fixed frequency PWM signal 805 that drives the SMPS circuitry, where the duty cycle of the PWM signal 805 is controlled by the duty value 806 (PWM_DUTY[9:0]) such that increases to the duty value 806 reduce the output voltage 801, and reductions to the duty value 806 increase the output voltage 801. To this end, a first comparator output ($CMP_{HI}$) detects any excursions past an upper reference voltage threshold ($VREF_H$), as indicated with waveform 803 wherein excursions are indicated with logic "1" values. In addition, any excursions past the lower reference voltage threshold ($VREF_L$) are detected with the second comparator output ($CMP_{LOW}$), as indicated with waveform 804 wherein excursions are indicated with logic "0" values.

Over the period of each PWM signal 805, the comparator outputs 803, 804 are monitored to detect the number of excursions with dedicated counters (CNT_ABOVE, CNT_BELOW, CNT_ABOVE_LAST, CNT_BELOW_LAST), and the excursion counts are then evaluated with the non-linear multi-step digital control loop detection sequence to generate one or more duty cycle adjustment instructions 807-814 which are applied to increase, maintain, or decrease the duty value 806 which controls the PWM signal 805. For example, a first duty cycle adjustment instruction 813 (SAME) may be issued when the output voltage is between the boundary voltage values ($VREF_H$, $VREF_L$) and not otherwise experiencing a fast transient condition, as described hereinabove with reference to the seventh detection step (Step 7). In addition, a second duty cycle adjustment instruction 811 (INC_A) may be issued when the output voltage exceeds the upper boundary voltage value ($VREF_H$) for only a portion of the PWM period and is not otherwise experiencing a fast transient condition, as described hereinabove with reference to the fifth detection step (Step 5). However, if the output voltage exceeds the upper boundary voltage value ($VREF_1$) for the entirety of the PWM period, then a third duty cycle adjustment instruction 807 (INC_B) may be issued as described hereinabove with reference to the first detection step (Step 1). In addition, a fourth duty cycle adjustment instruction 809 (FAST RISE) may be issued if the output voltage experiences a fast rise transient condition, as described hereinabove with reference to the second detection step (Step 2).

On the other hand, a fifth duty cycle adjustment instruction 812 (DEC_A) may be issued when the output voltage exceeds the lower boundary voltage value ($VREF_L$) for only a portion of the PWM period and is not otherwise experiencing a fast transient condition, as described hereinabove with reference to the sixth detection step (Step 6). However, if the output voltage exceeds the lower boundary voltage value ($VREF_L$) for the entirety of the PWM period, then a sixth duty cycle adjustment instruction 808 (DEC_B) may be issued as described hereinabove with reference to the third detection step (Step 3). In addition, a seventh duty cycle adjustment instruction 810 (DEC_B) may be issued if the output voltage experiences a fast fall transient condition, as described hereinabove with reference to the fourth detection step (Step 4). Finally, a eighth duty cycle adjustment instruction 814 (PWM_CLR) may be issued to turn OFF the PWM signal 805 if the minimum PWM pulse width is too high in driving the output voltage far above the upper boundary voltage value ($VREF_H$), as described hereinabove with reference to the eighth detection step (Step 8).

As disclosed herein, the SMPS digital controller method, system, and apparatus may be implemented with a pair of voltage threshold comparators in an integrated circuit microprocessor that is connected and controlled by control logic and/or computer program product having program code portions for performing steps of a method and/or for performing functions of a device or system for detecting output voltage excursions with a multi-step digital control loop detection sequence to enable corrective adjustments to the duty cycle of a PWM signal. Although embodiments are described in the context of monitoring output voltage excursions from a buck converter SMSP circuit, the proposed SMPS digital controller method, system, and apparatus may be implemented to detect and protect against output voltage excursions in a wide range of SMPS systems.

Some of the above embodiments, as applicable, may be implemented using a variety of different data processing systems. For example, although FIG. 2 and the discussion thereof describe an exemplary data processing architecture of microcontroller SoC device, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

By now it should be appreciated that there is provided herein a system, apparatus, and methodology for controlling a switch mode power supply (SMPS) without using analog-to-digital converter circuits. The switched mode power supply may include a digital controller and a buck converter circuit for receiving an input voltage and generating an output voltage that is fed back through the digital controller. In the disclosed methodology, an SMPS output voltage is compared to upper and lower reference voltage thresholds at first and second comparators to generate first and second comparator outputs over a plurality of sampling intervals during each cycle of a fixed frequency pulse width modulated (PWM) signal. In selected embodiments, the SMPS output voltage comparison is performed by connecting the SMPS output voltage in feedback as a shared input to the first and second comparators, where the first comparator is also connected to an upper reference voltage threshold input and where the second comparator is also connected to a lower reference voltage threshold input. Using dedicated counters, the first and second comparator outputs are monitored to detect excursion counts identifying how many times the SMPS output voltage exceeds the upper and lower reference voltage thresholds during each cycle of the fixed frequency PWM signal. In selected embodiments, the first and second comparator outputs may be monitored by clocking a first counter to detect how many times the first comparator output indicates that the SMPS output voltage exceeds the upper reference voltage threshold during each cycle of the fixed frequency PWM signal. In addition, a second counter may be clocked to detect how many times the second comparator output indicates that the SMPS output voltage exceeds the lower reference voltage threshold during each cycle of the fixed frequency PWM signal. At the end of each PWM signal cycle, the excursion counts from the dedicated counters are evaluated with a non-linear multi-step digital control loop detection sequence to generate duty cycle adjustment instructions for controlling each duty cycle of the fixed frequency PWM signal. For example, a first duty cycle adjustment instruction may be generated to increase a duty cycle of the fixed frequency PWM signal by a relatively large increment if the excursion counts from the dedicated counters indicate that the SMPS output voltage clearly exceeds the upper reference voltage threshold. Alternatively, a second duty cycle adjustment instruction may be generated to increase a duty cycle of the fixed frequency PWM signal by a relatively small increment if the excursion counts from the dedicated counters indicate that the SMPS output voltage is within a specified region of the upper reference voltage threshold. Alternatively, a third duty cycle adjustment instruction may be generated to decrease a duty cycle of the fixed frequency PWM signal by a relatively large decrement if the excursion counts from the dedicated counters indicate that the SMPS output voltage clearly exceeds the lower reference voltage threshold. Alternatively, a fourth duty cycle adjustment instruction may be generated to decrease a duty cycle of the fixed frequency PWM signal by a relatively small decrement if the excursion counts from the dedicated counters indicate that the SMPS output voltage is within a specified region of the lower reference voltage threshold. Alternatively, a fifth duty cycle adjustment instruction may be generated to increase a duty cycle of the fixed frequency PWM signal by a relatively large increment if the excursion counts from the dedicated counters indicate there is a fast fall transient in the SMPS output voltage. In selected embodiments, the fast fall transient in the SMPS output voltage may be detected by determining if a difference value between the excursion counts from a current PWM cycle and excursion counts from a previous PWM cycle exceeds a configurable fast fall transient threshold value (e.g., DUTY_VAL_TRANSIENT). Finally, a sixth duty cycle adjustment instruction may be generated to decrease a duty cycle of the fixed frequency PWM signal by a relatively large decrement if the excursion counts from the dedicated counters indicate there is a fast rise transient in the SMPS output voltage. In selected embodiments, the fast rise transient in the SMPS output voltage may be detected by determining if a difference value between the excursion counts from a current PWM cycle and excursion counts from a previous PWM cycle exceeds a configurable fast rise transient threshold value (e.g., DUTY_VAL_TRANSIENT). In response to each duty cycle adjustment instruction, the duty cycle of the fixed frequency PWM signal may be adjusted, and the fixed frequency PWM signal may then be supplied to drive a gate of a power switch transistor.

In another form, there is provided a method, apparatus, and system for controlling a switched mode power supply (SMPS) with first and second comparators and a digital control loop unit. As disclosed, the first and second comparators are coupled to compare an SMPS output voltage to, respectively, upper and lower reference voltage thresholds to generate first and second comparator outputs over a plurality of sampling intervals during each cycle of a fixed frequency pulse width modulated (PWM) signal. In addition, the digital control loop unit is coupled to monitor the first and second comparator outputs and to generate duty cycle adjustment instructions for controlling each duty cycle of the fixed frequency PWM signal based on a digital measure of any excursions by the SMPS output voltage past the upper and lower reference voltage thresholds during each cycle of the fixed frequency PWM signal. In selected embodiments, the digital control loop unit may include first and second clocked counters, where the first clocked counter is coupled to detect how many times the first comparator output indicates that the SMPS output voltage exceeds the upper reference voltage threshold during each cycle of the fixed frequency PWM signal, and where the second clocked counter is coupled to detect how many times the second comparator output indicates that the SMPS output voltage exceeds the lower reference voltage threshold during each cycle of the fixed frequency PWM signal. In addition, the digital control loop may include a duty value register that is coupled to receive a duty cycle adjustment instruction. In selected embodiments, the duty cycle adjustment instruction may increase or decrease, respectively, a duty cycle of the fixed frequency PWM signal by a relatively large step size if the digital measure indicates that the SMPS output voltage strongly exceeds the upper reference voltage threshold or lower reference voltage threshold. In other embodiments, the duty cycle adjustment instruction may increase or decrease, respectively, a duty cycle of the fixed frequency PWM signal by a relatively small step size if the digital measure indicates that the SMPS output voltage is within a specified region of the upper reference voltage threshold or lower reference voltage threshold. In other embodiments, the duty cycle adjustment instruction may increase or decrease, respectively, a duty cycle of the fixed frequency PWM signal by a relatively large step size if the digital measure indicates there is a fast fall transient or fast rise transient in the SMPS output voltage. In response to a corresponding duty cycle adjustment instruction from the digital control loop unit, a level shifter is provided for generating the fixed frequency PWM signal which is coupled to a gate terminal of a power switch transistor. By using the first and second comparators to compare the SMPS output voltage to the upper and lower reference voltage thresholds, an analog-to-digital converter is not needed or used. Selected embodiments of the disclosed system may include a user interface adapted to configure one or more configuration parameters to adapt the digital control loop unit to values of the switched mode power supply (SMPS).

In yet another form, there is provided a digital controller for a power supply. The disclosed digital controller includes a waveform generator for generating a fixed frequency pulse width modulated (PWM) signal having an adjustable duty cycle that is coupled to a gate terminal of a power switch transistor in a buck converter circuit for receiving an input voltage and generating an output voltage. The disclosed digital controller also includes a first comparator for comparing the output voltage to an upper reference voltage threshold to generate a first comparator output over a plurality of sampling intervals during each cycle of the fixed frequency PWM signal. The disclosed digital controller also includes a second comparator for comparing the output voltage to a lower reference voltage threshold to generate a second comparator output over the plurality of sampling intervals during each cycle of the fixed frequency PWM signal. The disclosed digital controller also includes a digital control loop unit coupled to monitor the first and second comparator outputs and to generate duty cycle adjustment instructions for controlling each duty cycle of the fixed frequency PWM signal based on a digital measure of any excursions by the output voltage past the upper and lower reference voltage thresholds during each cycle of the fixed frequency PWM signal. In selected embodiments, the digital control loop unit includes a first clocked counter coupled to detect how many times the first comparator output indicates that the SMPS output voltage exceeds the upper reference voltage threshold during each cycle of the fixed frequency PWM signal, and a second clocked counter coupled to detect how many times the second comparator output indicates that the SMPS output voltage exceeds the lower reference voltage threshold during each cycle of the fixed frequency PWM signal. In addition, the digital control loop unit may include a duty value register that is coupled to receive a duty cycle adjustment instruction to increase or decrease a duty cycle of the fixed frequency PWM signal in response to the digital measure. Selected embodiments of the disclosed system may include a user interface adapted to configure one or more configuration parameters to adapt the digital control loop unit to values of a switched mode power supply.

Various illustrative embodiments of the present invention have been described in detail with reference to the accompanying figures to illustrate exemplary embodiments in terms of an SMPS digital controller and associated method of operation in which upper and lower threshold voltage comparators are used to adjust the duty cycle of a PWM signal by implementing a non-linear multi-step digital control loop detection sequence, but the present disclosure is not necessarily limited to the example embodiments which illustrate inventive aspects of the present invention that are applicable to a wide variety of SMPS controllers. Thus, while various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Although the described exemplary embodiments disclosed herein are directed to an exemplary multi-channel direct memory access hardware engine, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:
1. A method for controlling a switch mode power supply (SMPS) comprising:
  comparing an SMPS output voltage to upper and lower reference voltage thresholds at first and second comparators to generate first and second comparator out- puts over a plurality of sampling intervals during each cycle of a fixed frequency pulse width modulated (PWM) signal;

monitoring the first and second comparator outputs with dedicated counters to detect excursion counts identifying how many times the SMPS output voltage exceeds the upper and lower reference voltage thresholds during each cycle of the fixed frequency PWM signal;

evaluating the excursion counts from the dedicated counters with a non-linear multi-step digital control loop detection sequence to generate duty cycle adjustment instructions for controlling each duty cycle of the fixed frequency PWM signal;

adjusting each duty cycle of the fixed frequency PWM signal in response to a corresponding duty cycle adjustment instruction; and supplying the fixed frequency PWM signal to drive a gate of a power switch transistor.

2. The method of claim 1, where comparing the SMPS output voltage comprises connecting the SMPS output voltage in feedback as a shared input to the first and second comparators, where the first comparator is also connected to an upper reference voltage threshold input and where the second comparator is also connected to a lower reference voltage threshold input.

3. The method of claim 1, where comparing the SMPS output voltage does not require use of an analog-to-digital converter.

4. The method of claim 1, where monitoring the first and second comparator outputs comprises:

clocking a first counter to detect how many times the first comparator output indicates that the SMPS output voltage exceeds the upper reference voltage threshold during each cycle of the fixed frequency PWM signal; and clocking a second counter to detect how many times the second comparator output indicates that the SMPS output voltage exceeds the lower reference voltage threshold during each cycle of the fixed frequency PWM signal.

5. The method of claim 1, where evaluating the excursion counts comprises generating a first duty cycle adjustment instruction to increase a duty cycle of the fixed frequency PWM signal by a relatively large increment if the excursion counts from the dedicated counters indicate that the SMPS output voltage clearly exceeds the upper reference voltage threshold.

6. The method of claim 1, where evaluating the excursion counts comprises generating a second duty cycle adjustment instruction to increase a duty cycle of the fixed frequency PWM signal by a relatively small increment if the excursion counts from the dedicated counters indicate that the SMPS output voltage is within a specified region of the upper reference voltage threshold.

7. The method of claim 1, where evaluating the excursion counts comprises generating a third duty cycle adjustment instruction to decrease a duty cycle of the fixed frequency PWM signal by a relatively large decrement if the excursion counts from the dedicated counters indicate that the SMPS output voltage clearly exceeds the lower reference voltage threshold.

8. The method of claim 1, where evaluating the excursion counts comprises generating a fourth duty cycle adjustment instruction to decrease a duty cycle of the fixed frequency PWM signal by a relatively small decrement if the excursion counts from the dedicated counters indicate that the SMPS output voltage is within a specified region of the lower reference voltage threshold.

9. The method of claim 1, where evaluating the excursion counts comprises generating a fifth duty cycle adjustment instruction to increase a duty cycle of the fixed frequency PWM signal by a relatively large increment if the excursion counts from the dedicated counters indicate there is a fast fall transient in the SMPS output voltage.

10. The method of claim 9, where the fast fall transient in the SMPS output voltage is detected by determining if a difference value between the excursion counts from a current PWM cycle and excursion counts from a previous PWM cycle exceeds a configurable fast fall transient threshold value.

11. The method of claim 1, where evaluating the excursion counts comprises generating a sixth duty cycle adjustment instruction to decrease a duty cycle of the fixed frequency PWM signal by a relatively large decrement if the excursion counts from the dedicated counters indicate there is a fast rise transient in the SMPS output voltage.

12. The method of claim 11, where the fast rise transient in the SMPS output voltage is detected by determining if a difference value between the excursion counts from a current PWM cycle and excursion counts from a previous PWM cycle exceeds a configurable fast rise transient threshold value.

13. A system for controlling a switched mode power supply (SMPS), comprising:

first and second comparators for comparing an SMPS output voltage to, respectively, upper and lower reference voltage thresholds to generate first and second comparator outputs over a plurality of sampling intervals during each cycle of a fixed frequency pulse width modulated (PWM) signal; and a digital control loop unit coupled to monitor the first and second comparator outputs and to generate duty cycle adjustment instructions for controlling each duty cycle of the fixed frequency PWM signal based on a digital measure of any excursions by the SMPS output voltage past the upper and lower reference voltage thresholds during each cycle of the fixed frequency PWM signal.

14. The system of claim 13, further comprising:

a level shifter for generating the fixed frequency PWM signal in response to a corresponding duty cycle adjustment instruction from the digital control loop unit; and a power switch transistor coupled to receive the fixed frequency PWM signal at a gate terminal.

15. The system of claim 13, where an analog-to-digital converter is not used for comparing the SMPS output voltage to the upper and lower reference voltage thresholds.

16. The system of claim 13, where the digital control loop unit comprises:

a first clocked counter coupled to detect how many times the first comparator output indicates that the SMPS output voltage exceeds the upper reference voltage threshold during each cycle of the fixed frequency PWM signal; and a second clocked counter coupled to detect how many times the second comparator output indicates that the SMPS output voltage exceeds the lower reference voltage threshold during each cycle of the fixed frequency PWM signal.

17. The system of claim 16, where the digital control loop comprises a duty value register that is coupled to receive a duty cycle adjustment instruction to increase or decrease, respectively, a duty cycle of the fixed frequency PWM signal by a relatively large step size if the digital measure indicates that the SMPS output voltage strongly exceeds the upper reference voltage threshold or lower reference voltage threshold.

18. The system of claim 17, where the digital control loop comprises a duty value register that is coupled to receive a duty cycle adjustment instruction to increase or decrease, respectively, a duty cycle of the fixed frequency PWM signal by a relatively small step size if the digital measure indicates that the SMPS output voltage is within a specified region of the upper reference voltage threshold or lower reference voltage threshold.

19. The system of claim 17, where the digital control loop comprises a duty value register that is coupled to receive a duty cycle adjustment instruction to increase or decrease, respectively, a duty cycle of the fixed frequency PWM signal by a relatively large step size if the digital measure indicates there is a fast fall transient or fast rise transient in the SMPS output voltage.

20. The system of claim 13, further comprising a user interface adapted to configure one or more configuration parameters to adapt the digital control loop unit to values of the switched mode power supply (SMPS).

21. A digital controller for a power supply comprising:
a waveform generator for generating a fixed frequency pulse width modulated (PWM) signal having an adjustable duty cycle that is coupled to a gate terminal of a power switch transistor in a buck converter circuit for receiving an input voltage and generating an output voltage;
a first comparator for comparing the output voltage to an upper reference voltage threshold to generate a first comparator output over a plurality of sampling intervals during each cycle of the fixed frequency PWM signal;
a second comparator for comparing the output voltage to a lower reference voltage threshold to generate a second comparator output over the plurality of sampling intervals during each cycle of the fixed frequency PWM signal; and
a digital control loop unit coupled to monitor the first and second comparator outputs and to generate duty cycle adjustment instructions for controlling each duty cycle of the fixed frequency PWM signal based on a digital measure of any excursions by the output voltage past the upper and lower reference voltage thresholds during each cycle of the fixed frequency PWM signal.

22. The digital controller of claim 21, where the digital control loop unit comprises:
a first clocked counter coupled to detect how many times the first comparator output indicates that the SMPS output voltage exceeds the upper reference voltage threshold during each cycle of the fixed frequency PWM signal; and
a second clocked counter coupled to detect how many times the second comparator output indicates that the SMPS output voltage exceeds the lower reference voltage threshold during each cycle of the fixed frequency PWM signal.

23. The digital controller of claim 21, where the digital control loop unit comprises a duty value register that is coupled to receive a duty cycle adjustment instruction to increase or decrease a duty cycle of the fixed frequency PWM signal in response to the digital measure.

24. The digital controller of claim 21, further comprising a user interface adapted to configure one or more configuration parameters to adapt the digital control loop unit to values of a switched mode power supply.

\* \* \* \* \*